(12) United States Patent
Denda

(10) Patent No.: US 7,808,606 B2
(45) Date of Patent: Oct. 5, 2010

(54) METHOD FOR MANUFACTURING SUBSTRATE, LIQUID CRYSTAL DISPLAY APPARATUS AND METHOD FOR MANUFACTURING THE SAME, AND ELECTRONIC DEVICE

(75) Inventor: Atsushi Denda, Suwa (JP)

(73) Assignee: Seiko Epson Corporation (JP)

( * ) Notice: Subject to any disclaimer, the term of this patent is extended or adjusted under 35 U.S.C. 154(b) by 155 days.

(21) Appl. No.: 12/166,386

(22) Filed: Jul. 2, 2008

(65) Prior Publication Data

US 2009/0027605 A1  Jan. 29, 2009

(30) Foreign Application Priority Data

Jul. 25, 2007  (JP) ............... 2007-192992

(51) Int. Cl.
  *G02F 1/13* (2006.01)
  *G02F 1/1343* (2006.01)
(52) U.S. Cl. .................. 349/187; 349/139; 349/147; 349/148
(58) Field of Classification Search ............. 349/139, 349/147, 148, 187
  See application file for complete search history.

(56) References Cited

U.S. PATENT DOCUMENTS

| | | | |
|---|---|---|---|
| 5,930,607 A | | 7/1999 | Satou |
| 7,522,243 B2 * | | 4/2009 | Fujiwara et al. ............ 349/139 |
| 7,602,456 B2 * | | 10/2009 | Tanaka et al. .............. 349/43 |
| 2004/0048405 A1 * | | 3/2004 | Hirota ..................... 438/29 |
| 2005/0007398 A1 * | | 1/2005 | Hirai ...................... 347/1 |
| 2006/0035175 A1 * | | 2/2006 | Hirota .................... 430/321 |
| 2006/0040214 A1 * | | 2/2006 | Hirota .................... 430/321 |
| 2007/0126968 A1 * | | 6/2007 | Uochi .................... 349/141 |

FOREIGN PATENT DOCUMENTS

| | | |
|---|---|---|
| JP | 03-082130 | 4/1991 |
| JP | 04-078826 | 3/1992 |
| WO | WO97-13177 | 4/1997 |

\* cited by examiner

*Primary Examiner*—Andrew Schechter
*Assistant Examiner*—Mary A El Shammaa
(74) *Attorney, Agent, or Firm*—Harness, Dickey & Pierce, P.L.C.

(57) ABSTRACT

A method for manufacturing a substrate, includes: coating the substrate with a first layer including a first metallic element by a dry deposition technique; coating the first layer with a photo resist layer; forming on the photo resist layer an exposure portion, a pair of non-exposure portions being in contact with the exposure portion and having a substantially parallel stripe-like plan shape, and a half exposure portion that is a part of an inner region of the non-exposure portions and an outer region of the non-exposure portions; removing the exposure portion and an upper portion of the half exposure portion, the upper portion having been exposed; forming an electrode portion and a wiring portion by etching the first layer exposed by removing the exposure portion; exposing the electrode portion and the wiring portion by removing the half exposure portion of which the upper portion has been removed, and forming a pair of banks by the pair of non-exposure portions; applying a treatment solution including a second metallic element on a recess portion formed by the wiring portion sandwiched between the pair of banks and the pair of banks by a droplet discharge technique; and forming a second layer including the second metallic element on the wiring portion by hardening the applied treatment solution to thicken the wiring portion.

4 Claims, 13 Drawing Sheets

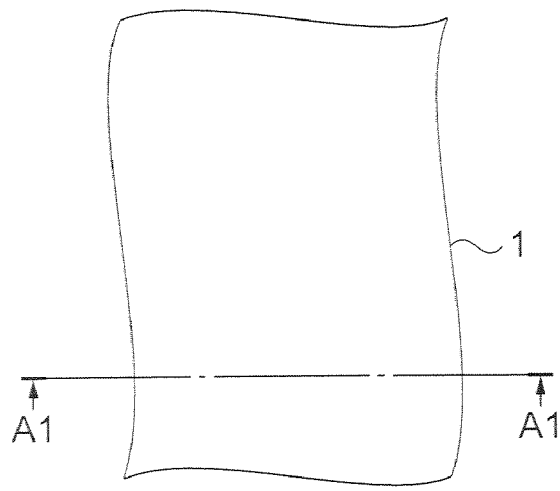
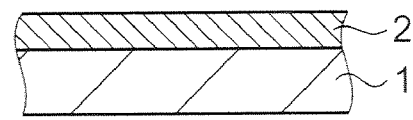
FIG.2A  FIG.2B
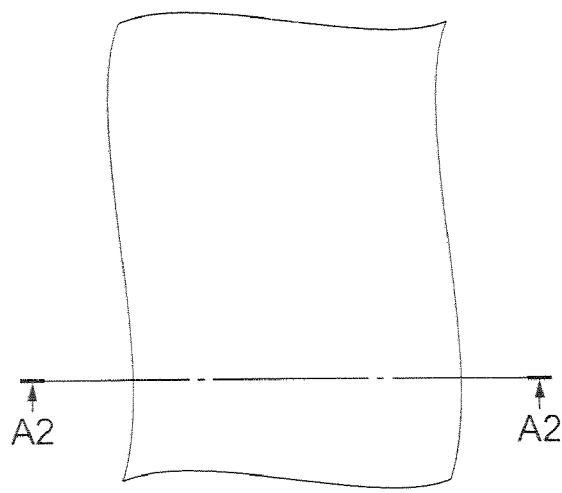
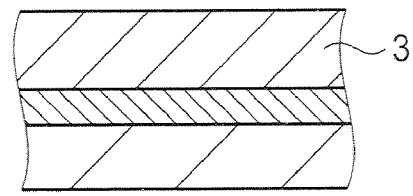
FIG.3A  FIG.3B

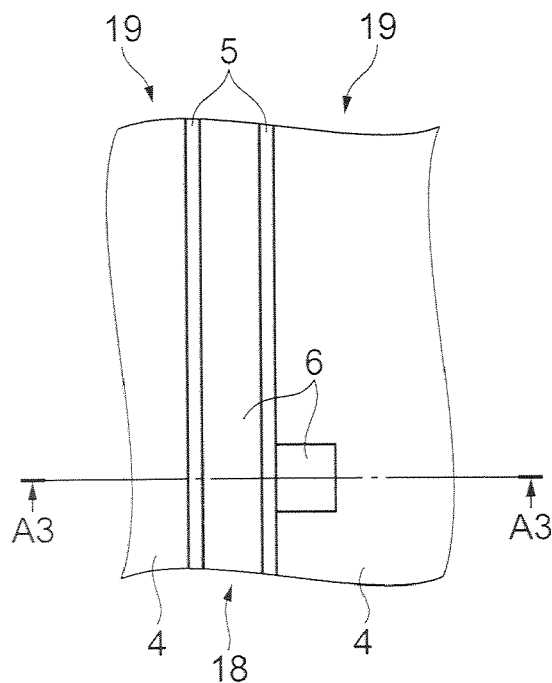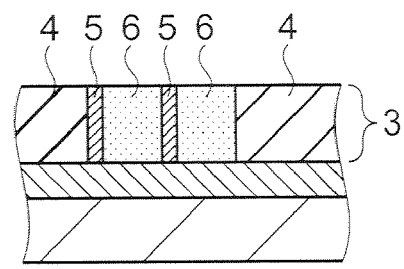
FIG.4A  FIG.4B
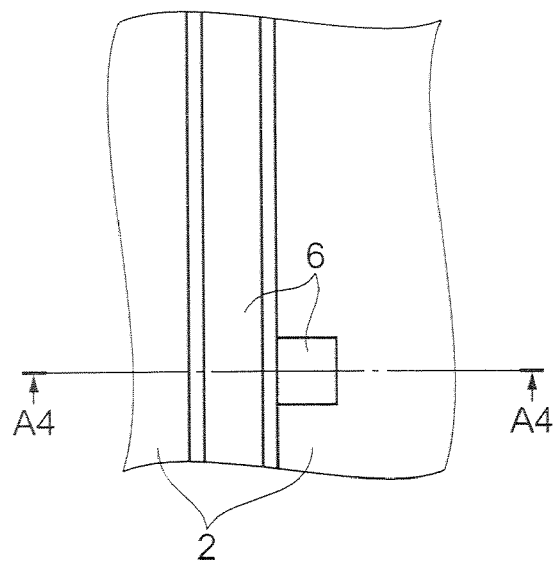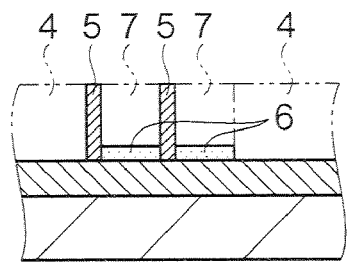
FIG.5A  FIG.5B

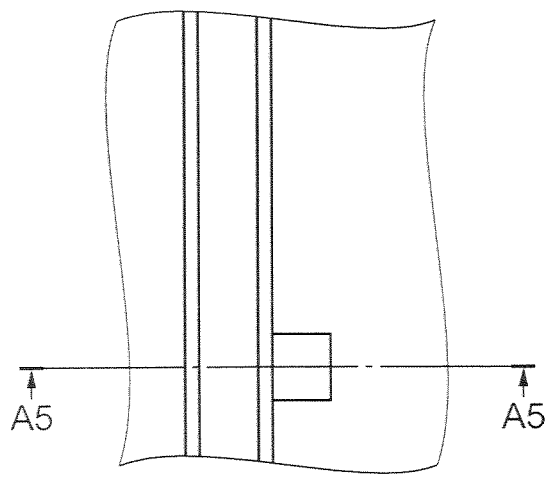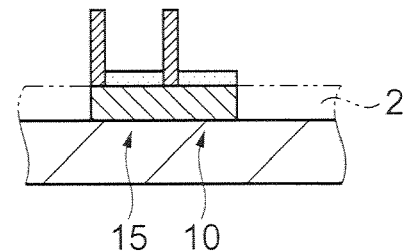
FIG.6A  FIG.6B
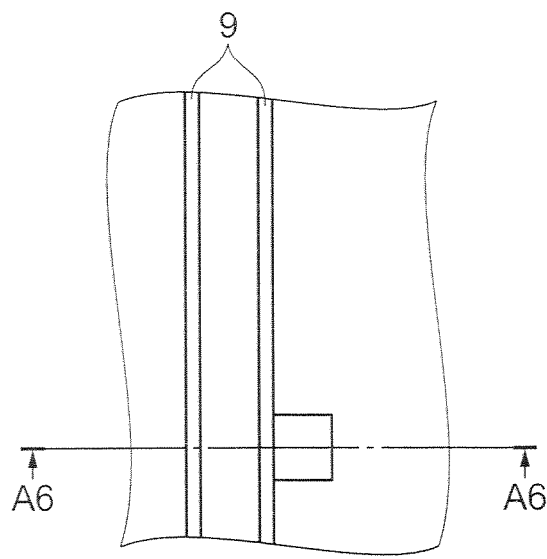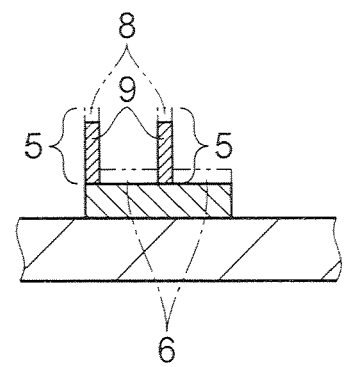
FIG.7A  FIG.7B

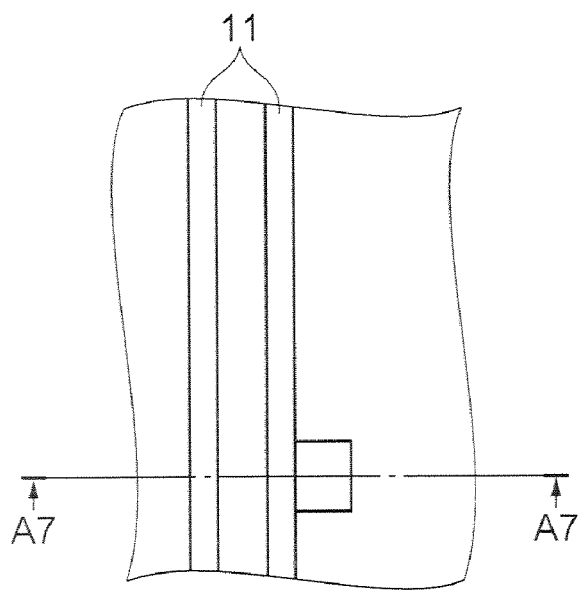
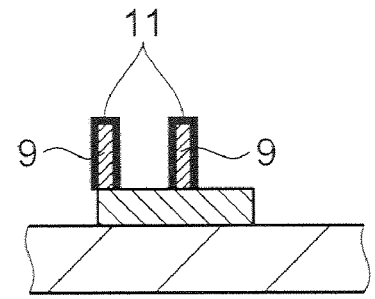
FIG.8A  FIG.8B
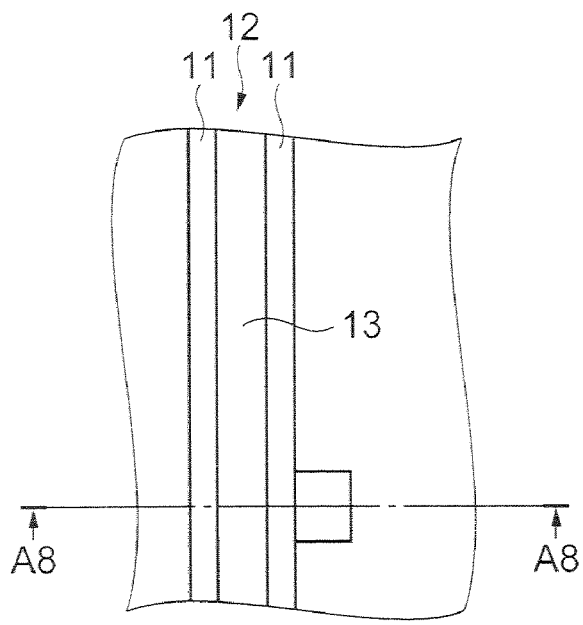
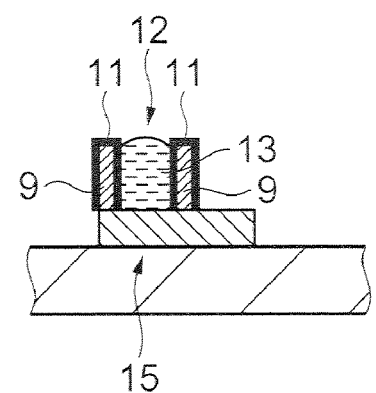
FIG.9A  FIG.9B

METHOD FOR MANUFACTURING SUBSTRATE, LIQUID CRYSTAL DISPLAY APPARATUS AND METHOD FOR MANUFACTURING THE SAME, AND ELECTRONIC DEVICE

BACKGROUND OF THE INVENTION

1. Technical Field

The present invention relates to a method for manufacturing a substrate, a liquid crystal display apparatus including an active matrix substrate and a method for manufacturing the same, and an electronic device having a liquid crystal display apparatus in its display portion.

2. Related Art

So far, a liquid crystal display apparatus including an active matrix substrate as an example of a substrate has been disclosed (see, for example, WO 97/13177, p. 23, p. 24, FIG. 17 and FIG. 19). A gate electrode as an electrode of a switching element portion (hereinafter, referred to as gate electrode portion), a drain electrode (hereinafter, referred to as drain electrode portion), and a source electrode portion, which are provided in this active matrix substrate, are formed by using a sputtering apparatus based on a dry deposition technique. Further, scanning lines as wirings provided in the active matrix substrate (hereinafter, referred to as gate wiring portion) or signal lines (hereinafter, referred to as source wiring portion) are also formed by using a sputtering apparatus based on a dry deposition technique. The gate electrode portion and the gate wiring portion are formed at the same time. Furthermore, the source electrode portion, the drain electrode portion, and the source wiring portion are formed at the same time.

However, with a recent tendency to enlarge the screen of a liquid crystal display apparatus, the substrate such as an active matrix substrate formed in the liquid crystal display apparatus has also been increasingly enlarged. With this enlargement, the lengths of the gate wiring portion and the source wiring portion formed in the active matrix substrate become larger than those of the conventional ones (before enlargement). As the lengths of the gate wiring portion and the source wiring portion become larger, the electric resistance values of the gate wiring portion and the source wiring portion become larger than those of the conventional ones. Since the electric resistance values of the gate wiring portion and the source wiring portion become larger, the power consumption of the liquid crystal display apparatus becomes larger. In view of this, the following idea has been considered: the thicknesses of the gate wiring portion and the source wiring portion are made to desired ones and the sectional areas of the gate wiring portion and the source wiring portion are made larger, thereby making the electric resistance values of the gate wiring portion and the source wiring portion smaller so as to achieve the reduction in power consumption of the liquid crystal display apparatus. However, in this case, as the thicknesses of the gate wiring portion and the source wiring portion are made to desired ones, the electrode thicknesses of the gate electrode portion, the drain electrode portion, and the source electrode portion of the switching element portion formed at the same time of the gate wiring portion and the source wiring portion are accordingly thickened. In the case in which those electrode thicknesses are thickened, the thickness of the switching element portion becomes larger than the desired thickness. When thus the thickness of the switching element portion becomes larger than the desired thickness, the shape of the section of the switching element portion becomes noticeably convex, so the local concentration of electric field is likely to occur within the switching element portion. Then, with the drop of the electric resistance value within a semiconductor portion, the generation of leak current as the performance deterioration of the switching element portion takes place. Accordingly, the wiring thicknesses of the gate wiring portion and the source wiring portion can be thickened only within the range, in which the performance deterioration of the switching element portion does not occur. Therefore, it is impossible to make the electric resistance values of the wiring portions sufficiently smaller, so there has been a problem in that the power consumption of the liquid crystal display apparatus is disadvantageously large.

SUMMARY

The present invention is proposed in order to solve the above-mentioned problem and can be embodied according to the following aspects.

According to a first aspect of the invention, a method for manufacturing a substrate includes: a first layer coating step for coating the substrate with a first layer including a first metallic element by a dry deposition technique; a photo resist layer coating step for coating the first layer with a photo resist layer; a halftone exposure step for forming on the photo resist layer an exposure portion, a pair of non-exposure portions being in contact with the exposure portion and having a substantially parallel stripe-like plan shape, and a half exposure portion, which is a part of an inner region of the non-exposure portions and an outer region of the non-exposure portions; a development step for removing the exposure portion and an upper portion, which has been exposed, of the half exposure portion; an electrode portion and wiring portion forming step for forming an electrode portion and a wiring portion by etching the first layer exposed by removing the exposure portion; a bank forming step for exposing the electrode portion and the wiring portion be removing the half exposure portion, of which the upper portion has been removed, and for forming a pair of banks by the pair of non-exposure portions; a treatment solution applying step for applying a treatment solution including a second metallic element on a recess portion formed by the wiring portion sandwiched between the pair of banks and the pair of banks by a droplet discharge technique; and a second layer forming step for forming a second layer including the second metallic element on the wiring portion by hardening the applied treatment solution to thicken the wiring portion.

According to the above construction, the electrode portion and the wiring portion are formed on the substrate by the first layer, and the second layer is formed on the wiring portion, which thickens the wiring portion. As a result, the sectional area of the wiring portion, which has been thickened, becomes large, and the electric resistance value of the wiring portion becomes small. As the electric resistance value of the wiring portion becomes small, the power consumption of the wiring portion is reduced. Therefore, it becomes possible to provide the method for manufacturing a substrate. As a result, the power consumption can be reduced.

Further, the treatment solution applied by the droplet discharge technique is hardened, thereby forming the second layer on the wiring portion, which thickens the wiring portion. According to the droplet discharge technique, it is possible to form a thick layer only on the site needed in a relatively short time. As a result, it becomes possible to easily form the second layer having large thickness and small electric resistance value only on the wiring portion. Accordingly, it becomes possible to achieve the method for manufacturing a substrate. As a result, the low power consumption can be achieved at low cost.

Furthermore, the pair of non-exposure portions and the half exposure portions of the photo resist layer formed in one step serve as corrosion-resistant layers at the time of etching of the first layer for forming the electrode portion and the wiring portion. Moreover, the pair of non-exposure portions serves as the pair of banks for maintaining the treatment solution for forming the second layer. As a result, the photo resist layer does not have to be formed in two steps, of which one is for forming the corrosion-resistant layers and the other is for forming the pair of banks. Accordingly, it becomes possible to achieve the method for manufacturing a substrate. As a result, the fabrication of the electrode portion and the wiring portion on the substrate can be simplified (with small number of steps) at low material cost.

According to a second aspect of the invention, a liquid crystal display apparatus includes: an active matrix substrate; a switching element portion and a wiring portion formed on the active matrix substrate; and an electrode portion formed on the switching portion. In the apparatus, a wiring thickness of the wiring portion is formed to be thicker than an electrode thickness of the electrode portion.

Compared with the electrode thickness of the electrode portion formed on the switching element portion, the wiring thickness of the wiring portion is thicker. The wiring thickness is thicker, so the sectional area of the wiring portion becomes large. As a result, it becomes possible to make the electric resistance value of the wiring portion smaller. Therefore, the low power consumption of the liquid crystal display apparatus including the active matrix substrate can be achieved.

In the liquid crystal display apparatus, it is preferable that: the active matrix substrate be made from an inorganic substrate; the electrode portion and the wiring portion be formed by a first layer including a first metallic element selected from Al, Ti, Cr, Zr, Nb, Mo and Ta; and a second layer including a second metallic element selected from Al, Cu, Ni and Ag that thickens the wiring portion be formed on the wiring portion.

According to the above construction, the electrode portion and the wiring portion are formed by the first layer including the first metallic element selected from Al, Ti, Cr, Zr, Nb, Mo, and Ta. The electrode portion and the wiring portion are formed while the inorganic substrate serves as their foundation. The first metallic element included in the first layer described above has such characteristics that it firmly combines with metallic element or metalloid element constituting the inorganic substrate through the intermediation of oxygen or nitrogen. Accordingly, it becomes possible to make the close contact between the first layer and the inorganic substrate sufficient. As a result, the durability of the liquid crystal display apparatus having the active matrix substrate can be enhanced.

Further, the electrode portion and the wiring portion are formed while the semiconductor portion or the insulating portion of the switching element portion serves as their foundation. The semiconductor portion is formed by amorphous silicon or doped amorphous silicon, for example. The insulating portion is formed by silicon nitride or oxide silicon, for example. The first metallic element included in the first layer has such characteristics that it firmly combines with the amorphous silicon, the doped amorphous silicon or the silicon constituting the silicon nitride through the intermediation of oxygen or nitrogen. Therefore, the close contact between the first layer and the foundation, on which the first layer is formed, can be made sufficient. Accordingly, the durability of the liquid crystal display apparatus including the active matrix substrate can be further enhanced.

Formed on the wiring portion formed by the first layer including the first metallic element is the second layer including the second metallic element. As a result, the first layer and the second layer come in direct contact with each other in the vicinity of their interface, so the metallic bonding can be easily take place. Therefore, the close contact and the conductivity between the first layer and the second layer can be made sufficient. Further, the second metallic element of the second layer selected from Al, Cu, Ni, and Ag has such characteristics that it has relatively small electric resistance value among metallic elements. Hence, the electric resistance value of the wiring portion, which has been thickened by the second layer, can be made relatively easily smaller. Accordingly, the low power consumption of the liquid crystal display apparatus having the active matrix substrate can be achieved.

In the liquid crystal display, it is preferable that: the first layer be formed by a dry deposition technique; and the second layer be formed by a droplet discharge technique.

According to the dry deposition technique, particles including the first metallic element that constitutes the first layer can receive high energy. Therefore, the close contact between the first layer and the above-mentioned foundation can be made further sufficient. Hence, the durability of the liquid crystal display apparatus including the active matrix substrate can be further enhanced.

According to the droplet discharge technique, a thick layer can be formed only at the desired position in a relatively short time. Therefore, it becomes possible to easily form the second layer having large thickness and small electric resistance value only on the wiring portion. Therefore, the low power consumption of the liquid crystal display apparatus including the active matrix substrate can be achieved at low cost.

According to a third aspect of the invention, a method for manufacturing a liquid crystal display apparatus including an active matrix substrate includes: a first layer coating step for coating the active matrix substrate with a first layer including a first metallic element by a dry deposition technique; a photo resist layer coating step for coating the first layer with a photo resist layer; a halftone exposure step for forming on the photo resist layer an exposure portion, a pair of non-exposure portions being in contact with the exposure portion and having a substantially parallel stripe-like plan shape, and a half exposure portion, which is a part of an inner region of the non-exposure portions and an outer region of the non-exposure portions by a halftone exposure; a development step for removing the exposure portion and an upper portion, which has been exposed, of the half exposure portion; an electrode portion and wiring portion forming step for forming an electrode portion and a wiring portion by etching the first layer exposed by removing the exposure portion; a bank forming step for exposing the electrode portion and the wiring portion by removing the half exposure portion, of which the upper portion has been removed, and for forming a pair of banks by the pair of non-exposure portions; a treatment solution applying step for applying a treatment solution including a second metallic element on a recess portion formed by the wiring portion sandwiched between the pair of banks and the pair of banks by a droplet discharge technique; and a second layer forming step for forming a second layer including the second metallic element on the wiring portion by hardening the applied treatment solution to thicken the wiring portion.

According to such construction, the electrode portion and the wiring portion are formed on the active matrix substrate by the first layer, and the second layer is formed on the wiring portion, which thickens the wiring portion. As a result, the sectional area of the wiring portion, which has been thickened, becomes large, and the electric resistance value of the wiring portion becomes small. As the electric resistance value of the wiring portion becomes small, the power consumption of the wiring portion is reduced. Therefore, it becomes possible to provide the method for manufacturing a substrate. As a result, the power consumption can be reduced.

Further, the treatment solution applied by the droplet discharge technique is hardened, thereby forming the second layer on the wiring portion, which thickens the wiring portion. According to the droplet discharge technique, it is possible to form a thick layer only on the site needed in a relatively short time. As a result, it becomes possible to easily form the second layer having large thickness and small electric resistance value only on the wiring portion. Accordingly, it becomes possible to achieve the method for manufacturing a substrate. As a result, the low power consumption can be achieved at low cost.

Furthermore, the pair of non-exposure portions and the half exposure portions of the photo resist layer formed in one step serve as corrosion-resistant layers at the time of etching of the first layer for forming the electrode portion and the wiring portion. Moreover, the pair of non-exposure portions serves as the pair of banks for maintaining the treatment solution for forming the second layer. As a result, the photo resist layer does not have to be formed in two steps, of which one is for forming the corrosion-resistant layers and the other is for forming the pair of banks. Accordingly, it becomes possible to achieve a method for manufacturing a substrate. As a result, the fabrication of the electrode portion and the wiring portion on the active matrix substrate can be simplified (with small number of steps) at low material cost.

In the method for manufacturing a liquid crystal apparatus, it is preferable that: the active matrix substrate be formed from an inorganic substrate; the first metallic element be a metallic element selected from Al, Ti, Cr, Zr, Nb, Mo and Ta; and the second metallic element be a metallic element selected from Al, Cu, Ni and Ag.

According to such construction, formed on the inorganic substrate is the first layer including the first metallic element selected from Al, Ti, Cr, Zr, Tb, Mo, and Ta. The first metallic element included in the first layer described above has such characteristics that it firmly combines with metallic element or metalloid element constituting the inorganic substrate through the intermediation of oxygen or nitrogen. Accordingly, it becomes possible to form the first layer on the inorganic substrate with enhanced adhesiveness. As a result, the durability of the liquid crystal display apparatus having the active matrix substrate can be enhanced.

Further, the second layer including the second metallic element selected from Al, Cu, Ni, and Ag is formed on the first layer. As a result, the first metallic element and the second metallic element come into close contact with each other in the vicinity of the interface between the first layer and the second layer, so metallic bonding is likely to occur. Therefore, it becomes possible to form the second layer on the first layer with enhanced adhesiveness and conductivity. Furthermore, the second metallic element of the second layer selected from Al, Cu, Ni and A5 has such characteristics that it has relatively small electric resistance value among metallic elements. Hence, it becomes possible to relatively easily form the second layer having small electric resistance value. Accordingly, it becomes possible to achieve the method for manufacturing the liquid crystal display apparatus. As a result, further low power consumption can be achieved.

The method for manufacturing a liquid crystal display apparatus may further include, between the bank forming step and the treatment solution applying step, a liquid-repellent layer forming step for forming a liquid-repellent layer on the pair of banks.

According to such construction, the liquid-repellent layer is formed on the pair of banks. The liquid-repellent layer has liquid-repellent characteristic. This liquid-repellent characteristic is due to low surface tension of the liquid-repellent layer itself. As a result, it becomes possible to prevent the treatment solution having larger surface tension than that of the liquid-repellent layer from leaking out of the pair of banks. Therefore, it becomes possible to achieve the method for manufacturing the liquid crystal display apparatus having excellent yield.

According to a fourth aspect of the invention, an electronic device having a display portion includes: in the display portion, the liquid crystal display apparatus, or the liquid crystal display apparatus formed by the method for manufacturing a liquid crystal display apparatus.

According to such construction, the display portion of the electronic device is provided with the above-mentioned liquid crystal display apparatus, or the liquid crystal display apparatus formed by the above method for manufacturing a liquid crystal display apparatus. That is to say, the display portion of the electronic device is provided with the liquid crystal display apparatus, in which low power consumption, the enhancement of the durability or the reduction in cost is achieved. The display portion is provided with the liquid crystal display apparatus formed on the basis of the above method for manufacturing a liquid crystal display apparatus, according to which the simplification of the formation of the liquid crystal display apparatus (with small number of steps) at low material cost is achieved, the close contact between the first layer and the second layer is enhanced, the second layer is relatively easily formed to have small electric resistance value, or excellent yield is achieved. As a result, it is possible to achieve the low power consumption, the enhancement of the durability or the reduction in cost of the electronic device.

BRIEF DESCRIPTION OF THE DRAWINGS

The invention will be described with reference to the accompanying drawings, wherein like numbers reference like elements.

FIG. 2A is a schematic view showing the substrate in a first layer coating step.

FIG. 2B is a schematic view showing the substrate in the first layer coating step.

FIG. 3A is a schematic view showing the substrate in a photo resist layer coating step.

FIG. 3B is a schematic view showing the substrate in the photo resist layer coating step.

FIG. 4A is a schematic view showing the substrate in a schematic view showing a substrate in a halftone exposure step.

FIG. 4B is a schematic view showing the substrate in a schematic view showing a substrate in the halftone exposure step.

FIG. 5A is a schematic view showing the substrate in a development step.

FIG. 5B is a schematic view showing the substrate in the development step.

FIG. 6A is a schematic view showing the substrate in an electrode portion and wiring portion forming step.

FIG. 6B is a schematic view showing the substrate in the electrode portion and wiring portion forming step.

FIG. 7A is a schematic view showing the substrate in a bank forming step.

FIG. 7B is a schematic view showing the substrate in the bank forming step.

FIG. 8A is a schematic view showing the substrate in a liquid-repellent layer forming step.

FIG. 8B is a schematic view showing the substrate in the liquid-repellent layer forming step.

FIG. 9A is a schematic view showing the substrate in a treatment solution applying step.

FIG. 9B is a schematic view showing the substrate in the treatment solution applying step.

DESCRIPTION OF EXEMPLARY EMBODIMENTS

Hereinafter, embodiments of the invention will be described with reference to the attached drawings. The drawings, to which reference will be made in the following, are schematic drawings, in which lateral and longitudinal scales of elements or parts are different from those of the actual ones for the sake of easiness of drawings.

First Embodiment

Figure 1:
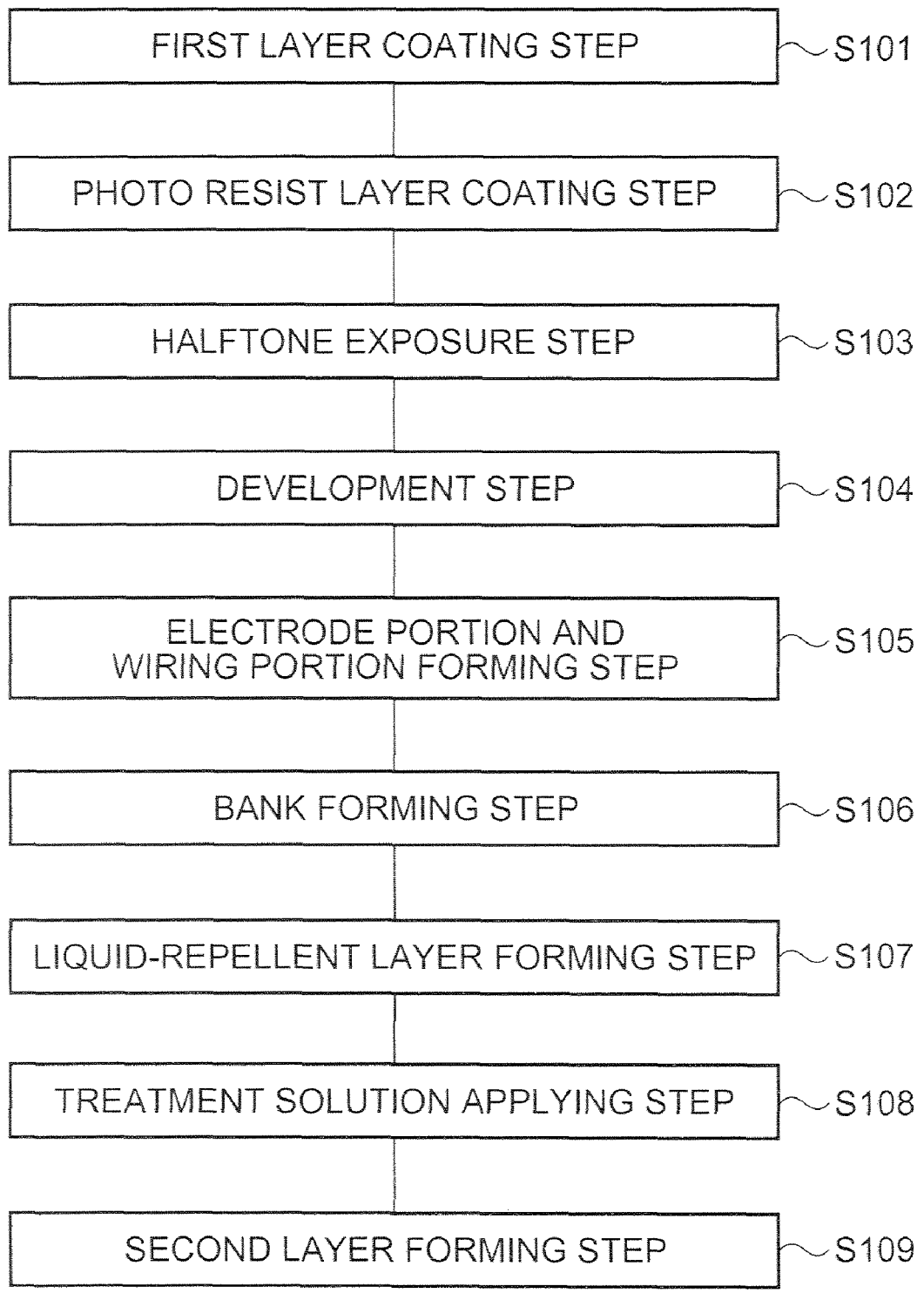
FIG. 1 is a process chart showing a method for manufacturing a substrate according to a first embodiment.

A method for manufacturing a substrate according to a first embodiment will be described below. FIG. 1 is a view showing steps of the method for manufacturing a substrate according to the first embodiment. As shown in FIG. 1, the method for manufacturing a substrate according to this embodiment of the invention includes a step S101 corresponding to a first layer coating step, a step S102 corresponding to a photo resist layer coating step, a step S103 corresponding to a halftone exposure step, a step S104 corresponding to a development step, a step S105 corresponding to an electrode and wiring portion forming step, a step S106 corresponding to a bank forming step, a step S107 corresponding to a liquid-repellent layer forming step, a step S108 corresponding to a treatment solution applying step, and a step S109 corresponding to a second layer forming step.

FIG. 2A through FIG. 10B are views showing respective substrates corresponding to the step S101 through S109. The explanation of the method for manufacturing a substrate will go on while refereeing to FIG. 1 and following FIG. 2A through FIG. 10B. FIG. 2A is a partial plan view showing a substrate of the step S101 and FIG. 2B is a sectional view taken along with the line A1-A1 of FIG. 2A. As an example of the substrate shown in FIG. 2A and FIG. 2B, a glass substrate 1, which is an inorganic substrate, is used. As shown in FIG. 2A and FIG. 2B, in the step S101, the glass substrate 1 is coated with a Ti layer 2 as a first layer. A sputtering technique is employed for a coating technique with the Ti layer 2. The Ti layer 2 has such characteristics that it firmly combines with Si, which is a metalloid element constituting the glass substrate 1, and a metallic element through the intermediation of oxygen or nitrogen. Therefore, it is possible to form the Ti layer 2 on the glass substrate 1 with high adhesiveness.

FIG. 3A is a partial plan view showing the substrate of the step S102 and FIG. 3B is a sectional view taken along with the line A2-A2 of FIG. 3A. As shown in FIG. 3A and FIG. 3B, in the step S102, the Ti layer 2 is coated with a photo resist layer 3. A spinning technique is employed for the coating technique.

FIG. 4A is a partial plan view showing the substrate of the step S103 and FIG. 4B is a sectional view taken along with the line A3-A3 of FIG. 4. As shown in FIG. 4A and FIG. 4B, in the step S103, a halftone exposure utilizing a multiple tone mask (not shown) is employed in order to form an exposure part 4, a non-exposure part 5 and a half exposure part 6 on the photo resist layer 3. Here, a pair of non-exposure parts 5 is in contact with the exposure part 4 and has substantially parallel stripe-like plan shape. The half exposure part 6 is a part of an inner region 18 of the pair of non-exposure parts 5 and an outer region 19 of the pair of non-exposure parts 5.

FIG. 5A is a partial plan view showing the substrate of the step S104 and FIG. 5B is a sectional view taken along with the line A4-A4 of FIG. 5A. As shown in FIG. 5A and FIG. 5B, in the step S104, the exposure part 4 and an upper layer part 7, which is a part of the half exposure part 6 subjected to exposure to light, are removed by making those dissolve in developing solution.

FIG. 6A is a partial plan view showing the substrate of the step S105 and FIG. 6B is a sectional view taken along with the line A5-A5 of FIG. 6A. As shown in FIG. 6A and FIG. 6b, in the step S105, the Ti layer 2, which has been exposed in the step S104, is subjected to etching, thereby forming an electrode portion 10 and a wiring portion 15. A dry etching technique utilizing gas containing elemental fluorine is employed for etching technique.

FIG. 7A is a partial plan view showing the substrate of the step S106 and FIG. 7B is a sectional view taken along with the line A6-A6 of FIG. 7A. As shown in FIG. 7A and FIG. 7B, in the step S106, a surface layer part 8 of the pair of non-exposure parts 5 is removed by anisotropic ashing technique using oxygen gas. Then, the half exposure part 6, of which the upper layer part 7 has been removed, is removed by the above-mentioned anisotropic ashing technique. By removing the half exposure part 6, of which the upper layer part 7 has been removed, a new face of the part of non-exposure parts 5 emerges. The half exposure part 6, of which the upper layer part 7 has been removed, is removed and a new face of the part of non-exposure parts 5 emerges, thereby forming a part of banks 9.

FIG. 8A is a partial plan view showing the substrate of the step S107 and FIG. 8B is a sectional view taken along with the line A7-A7 of FIG. 8A. As shown in FIG. 8A and FIG. 5B, in the step S107, a liquid-repellent layer 11 is formed on the part of banks 9 by plasma treatment technique using gas containing elemental fluorine.

FIG. 9A is a partial plan view showing the substrate of the step S1-8 and FIG. 9B is a sectional view taken along with the line A8-A8 of FIG. 9A. As shown in FIG. 9A and FIG. 9B, in the step S108, a treatment solution 13 containing Al is applied on a recess portion 12 formed by the wiring portion 15, which is sandwiched between the part of banks 9, and the part of banks 9 by using droplet discharge technique described later. The treatment solution 13 has a round surface shape since it is repelled by the liquid-repellent layer 11 due to the relation of the surface tension of the treatment solution 13 and that of the liquid-repellent layer 11.

Figure 10A:
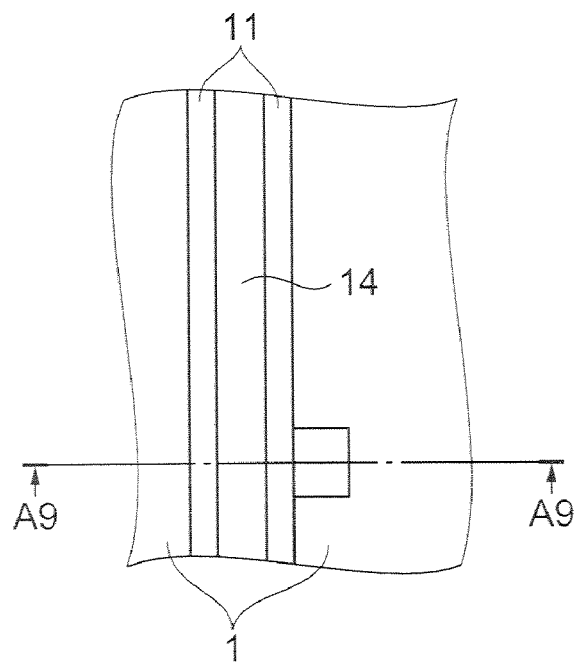
FIG. 10A is a schematic view showing the substrate in a second layer forming step.
Figure 10B:
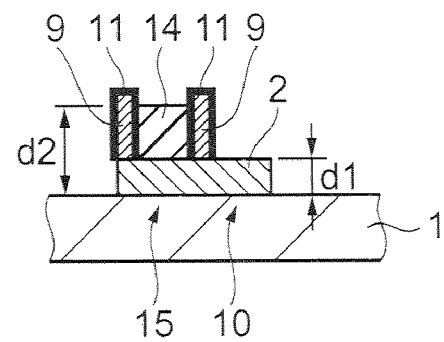
FIG. 10B is a schematic view showing the substrate in the second layer forming step.

FIG. 10A is a partial plan view showing the substrate of the step S109 and FIG. 10B is a sectional view taken along with the line A9-A9 of FIG. 10A. As shown in FIG. 10A and FIG. 10B, in the step S109, the treatment solution 13 applied is subjected to heat so that it hardens. By so doing, an Al layer 14 as a second layer is formed on the wiring portion 15. Metallic elements come into direct contact with each other at an interface between the Ti layer 2 and the Al layer 14 of the wiring portion 15 so that association of metallic elements takes place. As a result, it becomes possible to form the Al layer 14 on the wiring portion 15 with high adhesiveness and excellent conductivity. Further, Al of the Al layer 14 has such characteristics that it has relatively small electric resistance value among metallic elements. Therefore, it is possible to relatively easily form the Al layer 14 having small electric resistance value. As thus described above, the electrode portion 10 and the wiring portion 15, whose layer is thickened by the Al layer 14, are formed. Here in this case, a wiring thickness d2 is thicker than an electrode thickness d1.

Figure 11:
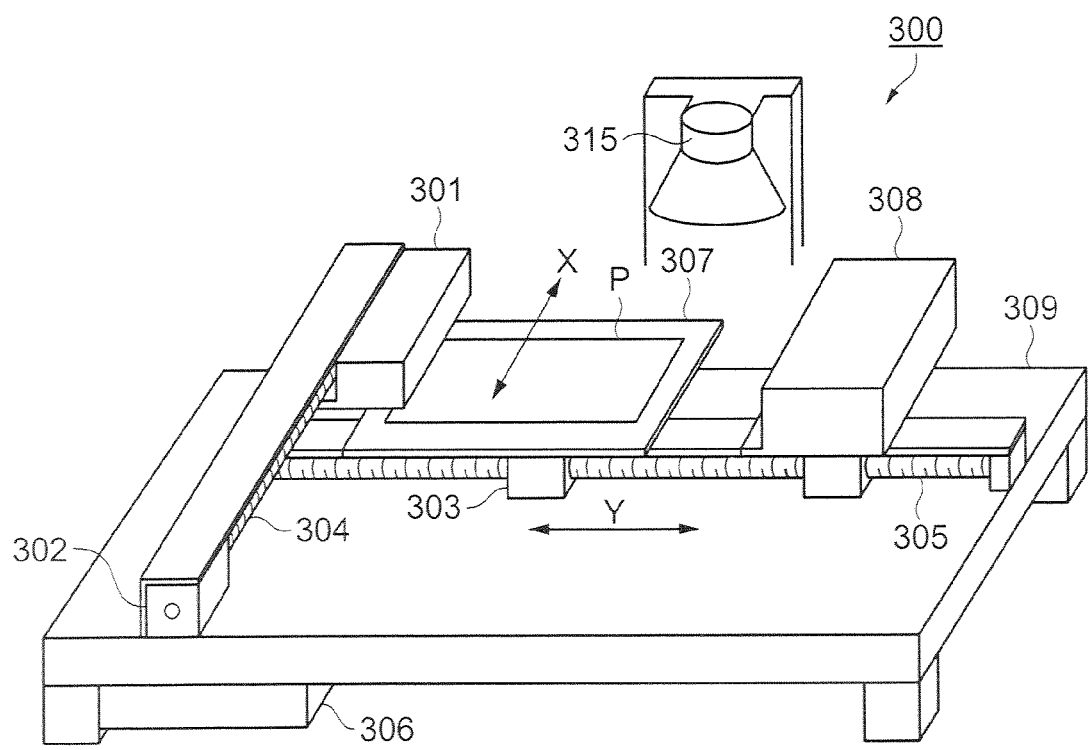
FIG. 11 is a perspective view showing a droplet discharge apparatus.

Next, the droplet discharge technique will be described. FIG. 11 is a perspective view showing a droplet discharge apparatus used in the droplet discharge technique. The droplet discharge apparatus 300 shown in FIG. 11 is used for applying the treatment solution and is such an apparatus that employs ink-jet technique of an electromechanical transduction type. There are known various types for the droplet discharge apparatus; however, one employing ink-jet technique is preferable, for ink-jet technique enables discharge of fine small droplet and is therefore suitably used for microfabrication. As shown in FIG. 11, the droplet discharge apparatus 300 has a droplet discharge head 301, an X direction drive axis 304, a Y direction drive axis 305, a control apparatus 306, a stage 307, a cleaning system 308, a base table 309, and a heater 315. The stage 307 is used for supporting the substrate P and has a fixing system (not shown) for fixing the substrate P in a reference place.

The droplet discharge head 301 is one of multi nozzle type having a plurality of discharge nozzles, wherein the longitudinal direction coincides with the X direction. The plurality of discharge nozzles are provided with a predetermined distance in the X direction on the lower surface of the droplet discharge head 301. The plurality of discharge nozzles is provided so as to be oriented substantially vertically to the substrate P. Droplet from the plurality of discharge nozzles of the droplet discharge head 301 is discharged to the substrate P.

Connected with the X direction drive axis 304 is an X direction drive motor 302. The X direction drive motor 302 is, for example, a stepping motor, which rotates the X direction drive axis 304 when supplied with a drive signal in the X direction from the control apparatus 306. When the X direction drive axis 304 rotates, the droplet discharge head 301 moves in the X direction.

The Y direction drive axis 305 is fixed with respect to the base table 309. The stage 307 has a Y direction drive motor 303. The Y direction drive motor 303 is, for example, a stepping motor and makes, when supplied with a drive signal in the Y direction from the control apparatus 307, the stage 307 move in the Y direction.

The control apparatus 306 supplies the droplet discharge head 301 with voltage for discharge control of droplet. Further, the control apparatus 306 supplies the X direction drive motor 302 with a drive pulse signal for controlling the movement in the X direction of the droplet discharge head 301. Furthermore, the control apparatus 306 supplies the Y direction drive motor 303 with a drive pulse signal for controlling the movement in the Y direction of the stage 307.

The cleaning system 308 is designed for cleaning the droplet discharge head 301. The cleaning system 308 is provided with a drive motor in the Y direction (not shown). The cleaning system 308 moves along the Y direction drive axis 305 by the drive of the drive motor in the Y direction. The movement of the cleaning system 308 is also controlled by the control apparatus 306.

A heater 315 is a unit for performing heat treatment of the substrate P by, for example, rapid thermal annealing. The heater 315 carries out evaporation and drying of solvent contained in the treatment solution applied on the substrate P. The switch on and off of the heater 315 is also controlled by the control apparatus 306.

The droplet discharge apparatus 300 discharges droplet to the substrate P while performing relative scanning of the droplet discharge head 301 and the stage 307 supporting the substrate P. In this case, the X direction is an operation direction while the Y direction orthogonal to the X direction is a non scanning direction. The discharge nozzles of the droplet discharge head 301 are provided at a predetermined distance in the X direction. As shown in FIG. 11, the droplet discharge head 301 is arranged at a right angle to the moving direction of the substrate P (Y direction). It is also possible to arrange the droplet discharge head 301 to intersect with the moving direction of the substrate P by performing adjustment of the angle of the droplet discharge head 301. By this, it becomes possible to adjust the pitch between the nozzles in the X direction. Further, the distance between the substrate P and the nozzle surface may be adjusted arbitrarily.

Figure 12:
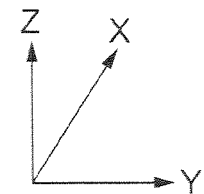
FIG. 12 is a perspective view showing a droplet discharge head.
Figure 12:
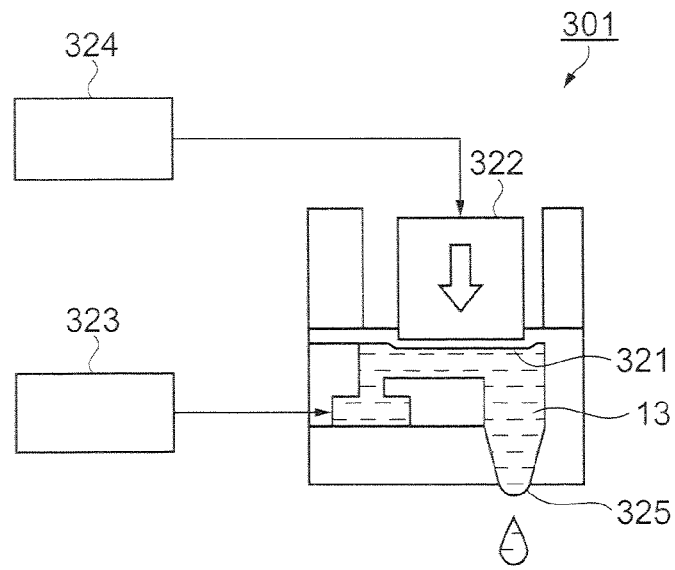

FIG. 12 is a sectional view showing the droplet discharge head. As shown in FIG. 12, the droplet discharge head 301 is provided with a piezoelectric element 322 adjacent to a liquid chamber 321 containing the treatment solution 13. The liquid chamber 321 is supplied with the treatment solution 13 via a treatment solution supplying system 323 including a tank containing the treatment solution 13. The piezoelectric element 322 is connected with a drive circuit 324. The piezoelectric element 322 is supplied with voltage via the drive circuit 324 so that the piezoelectric element 322 becomes deformed. By so doing, the liquid chamber 321 becomes deformed, thereby discharging the treatment liquid from a nozzle 325. In this case, the amount of deformation of the piezoelectric element 322 is controlled by changing the value of the voltage applied. Further, the speed of deformation of the piezoelectric element 322 is controlled by changing the frequency of the voltage applied. The droplet discharge using the piezoelectric element 322 does not apply any heat to the treatment solution 13, so it advantageously hardly affects the composition of materials contained in the treatment solution 13.

According to the first embodiment described above, the following advantageous effects can be obtained:

(1) The electrode portion 10 and the wiring portion 15 are formed on the glass substrate 1 by using the Ti layer 2 and the Al layer 14 is formed on the wiring portion 15, which thickens the wiring portion 15. As a result, the cross-sectional area of the wiring portion 15, which has been thickened, becomes large, so the electric resistance value of the wiring portion 1 becomes small. As the electric resistance value of the wiring portion 15 becomes small, the power consumption of the wiring portion 15 becomes small. Therefore, it is possible to achieve a method for manufacturing a substrate, in which small power consumption is achieved.

(2) The treatment solution 13 applied by a droplet discharge technique hardens, thereby forming the Al layer 14 on the wiring portion 15, which thickens the wiring portion 15. According to droplet discharge technique, a thick layer can be formed only on the site required in a relatively short time. As a result, it becomes possible to easily form the Al layer 14 having large thickness having small electric resistance value only on the wiring portion 15. Hence, it becomes possible to achieve a method for manufacturing a substrate capable of achieving small power consumption at low cost.

(3) The pair of non-exposure parts 5 and the half exposure part 6 of the photo resist layer 3 formed in one step function as corrosion-resistant layers at the time of etching of the Ti layer 2 for forming the electrode portion 10 and the wiring portion 15. Further, the pair of non-exposure parts 5 functions as the pair of banks 9 for maintaining the treatment solution 13 forming the Al layer 14. Accordingly, it is not needed to form the photo resist layer 3 in two steps, of which one is for forming the corrosion-resistant layers and the other is for forming the pair of banks 9. As a result, it becomes possible to achieve the method for manufacturing a substrate, according to which the formation of the electrode portion 10 and the wiring portion 15 on the glass substrate 1 is simplified (with a small number of manufacturing steps) and carried out at a low cost.

(4) Formed on the pair of banks 9 is the liquid-repellent layer 11 having elemental fluorine. The liquid-repellent layer 11 including elemental fluorine has a low surface tension due to elemental fluorine. Accordingly, the surface tension of the treatment solution 13 is larger than that of the liquid-repellent layer 11. As a result, the treatment solution 13 applied on the liquid-repellent layer 11 has round surface shape. Therefore, the treatment solution 13 can be prevented from leaking from the pair of banks 9. Hence, it becomes possible to achieve the method for manufacturing a substrate having excellent yield.

Second Embodiment

Figure 13A:
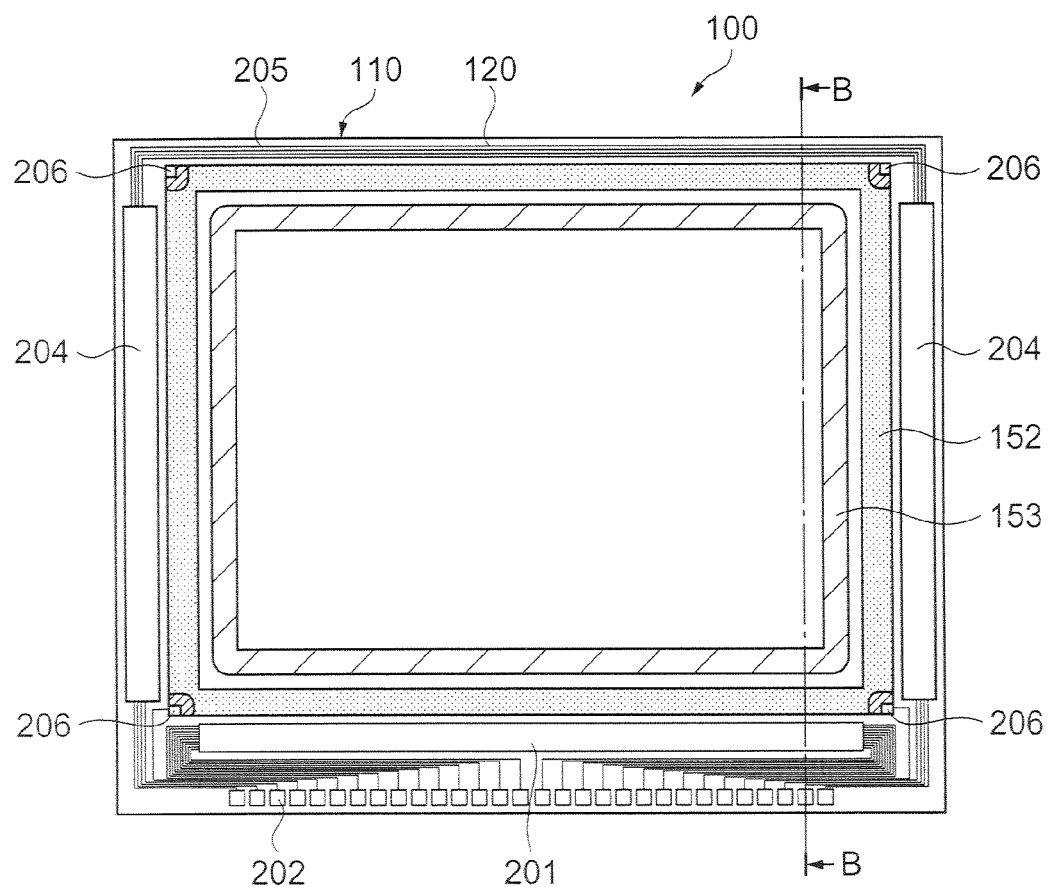
FIG. 13A is a schematic view showing a liquid crystal display apparatus according to a second embodiment.
Figure 13B:
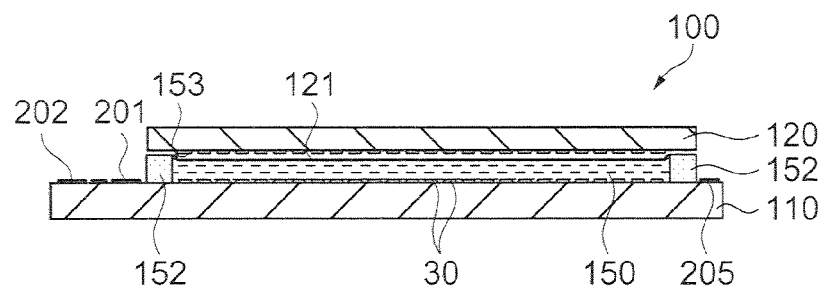
FIG. 13B is a schematic view showing the liquid crystal display apparatus according to the second embodiment.

As to a second embodiment of the invention, the explanation for the same contents of the above-mentioned embodiment of the invention will be omitted and only the different contents will be described. First, a liquid crystal display apparatus according to the second embodiment will be explained. FIG. 13A is a plan view showing the liquid crystal display apparatus according to the second embodiment and FIG. 13B is a sectional view taken along with the line B-B of FIG. 13A. As shown in FIG. 13A and FIG. 13B, in the liquid crystal display apparatus 100, a TFT array substrate 110 containing an active matrix substrate and an opposite substrate 120 are bonded with each other by a seal member 152, which is a light curing sealing agent. Liquid crystal 150 is sealed and maintained within a region defined by the seal member 152.

Formed in the region within the seal member 152 is a surrounding break line 153 made up of light shielding material. Formed in the region outside of the seal member 152 are a signal line (source wiring portion) drive circuit 201 and a mounting element 202 along one side of the TFT array substrate 110. Formed along two sides adjacent to the one side is a scanning line (gate wiring portion) drive circuit 204. Formed along the remaining side of the TFT array substrate 110 is a plurality of wiring 205 for connecting between the scanning line drive circuits 204 provided on the both sides of an image display region. Further, an inter-substrate conducting material 206 for establishing electrical conduction between the TFT array substrate 110 and the opposite substrate 120 is provided on at least one site of the corner portion of the opposite substrate 120.

Note that in the liquid crystal display apparatus 100, elements included in the TFT array substrate 110 other than the active matrix substrate are made by a known technique. Therefore, the explanation of the elements other than the active matrix substrate is omitted.

Figure 14:
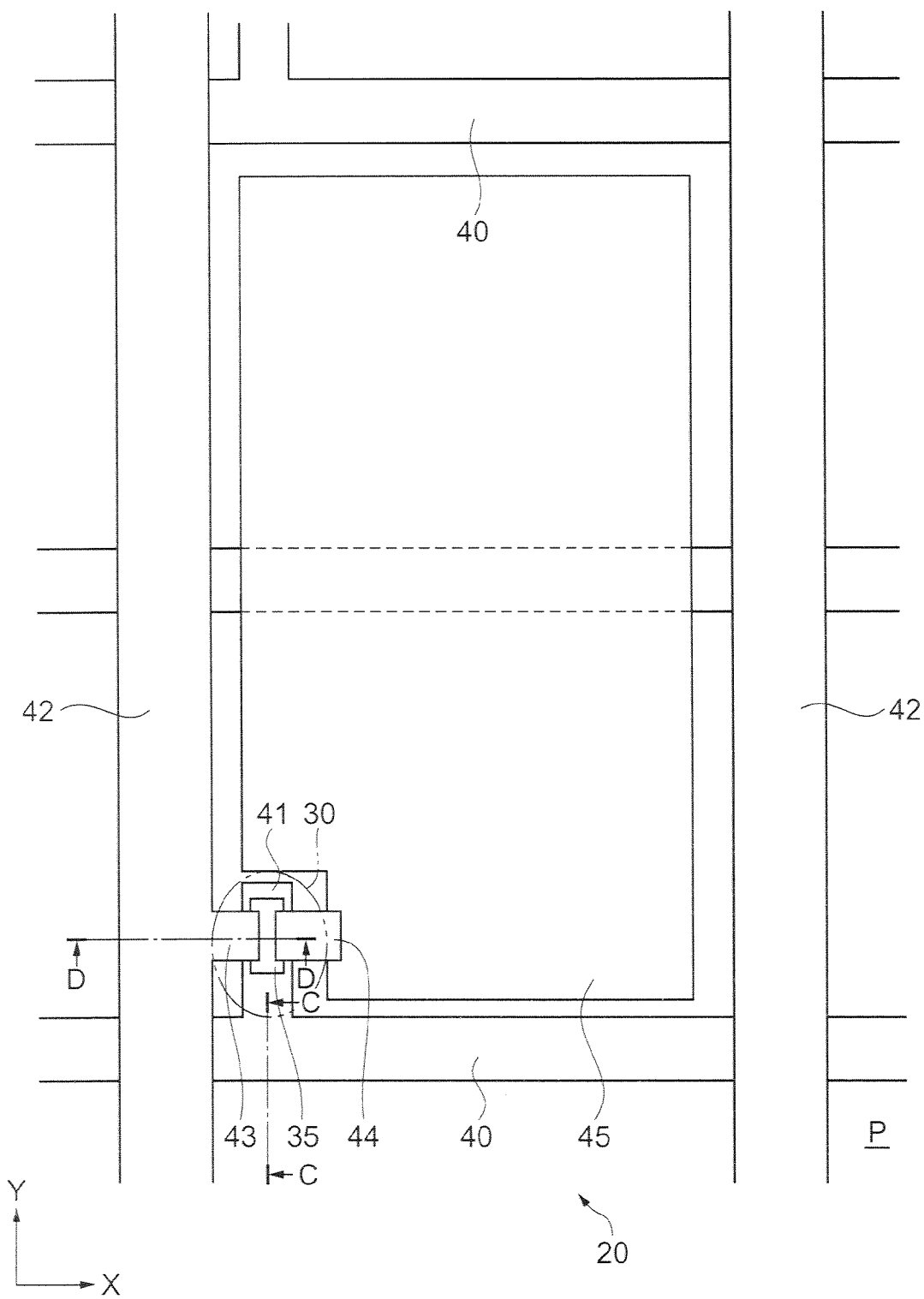
FIG. 14 is a partial plan view showing an active matrix substrate of the liquid crystal display apparatus.
Figure 15A:
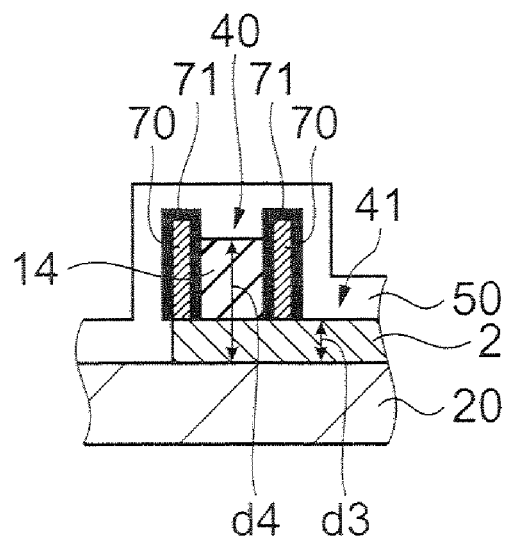
FIG. 15A is a sectional view taken along with the line C-C of FIG. 14.
Figure 15B:
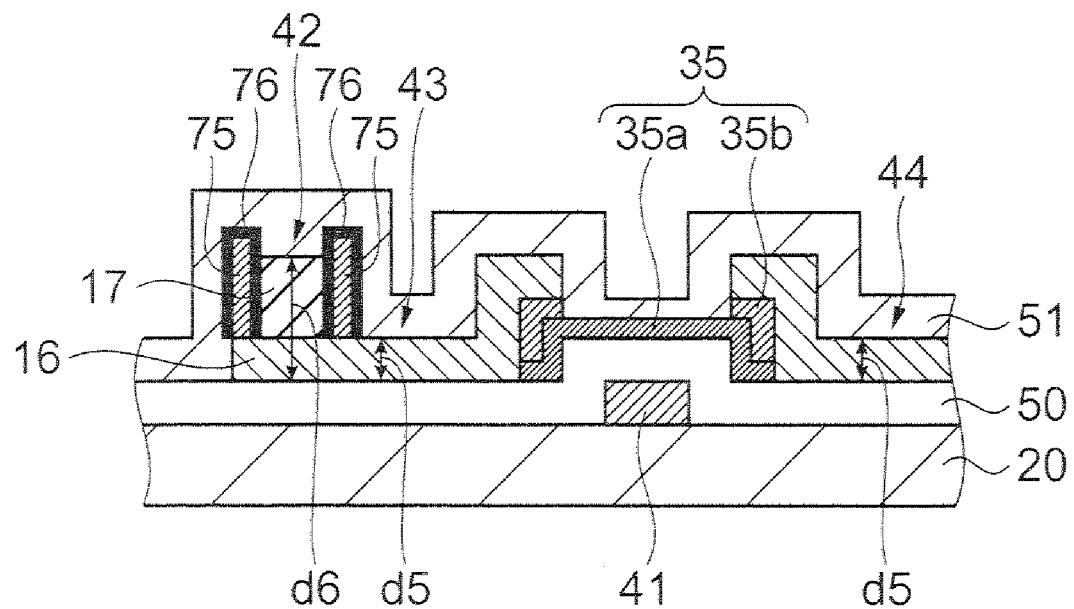
FIG. 15B is a sectional view taken along with the line D-D of FIG. 14.

Next, the active matrix substrate of the liquid crystal display apparatus 100 will be described. FIG. 14 is a partial plan view showing the active matrix substrate of the liquid crystal display apparatus. FIG. 15A is a sectional view taken along with the line C-C of FIG. 14 and FIG. 15B is a sectional view taken along with the line D-D of FIG. 14. Used for the active matrix substrate shown in FIG. 14, FIG. 15A and FIG. 15B is, for example, a glass substrate 20. As shown in FIG. 14, FIG. 15A and FIG. 15B, the glass substrate 20 has a switching element portion 30, a gate wiring portion 40 and a source wiring portion 42, both of which are wiring portions. Formed on the switching element portion 30 are a gate electrode portion 41, a source electrode portion 43, a drain electrode portion 44, a semiconductor portion 35, and insulating portion 50, 51 (not shown in FIG. 14). The gate wiring portion 40 and the source wiring portion 42 are formed so as to have grid-like shape. That is to say, a plurality of gate wiring portion 40 is formed along the X direction and a plurality of source wiring portion 42 is formed along the Y direction. Connected to the gate wiring portion 40 is the gate electrode portion 41. Formed on the gate wiring portion 40 and the gate electrode portion 41 is the insulating portion 50. Arranged on the gate electrode portion 41 is the semiconductor portion 35 (having a first semiconductor portion 35a and a second semiconductor portion 35b) via the insulating portion 50. On the other hand, connected to the source wiring portion 42 formed on the insulating portion 50 is the source electrode portion 43 formed on the insulating portion 50. One end of the source electrode portion 43 is electrically connected to the semiconductor portion 35. A pixel electrode portion 4a is arranged in a region surrounded by the gate wiring portion 40 and the source wiring portion 42. One end of the pixel electrode portion 45 is electrically connected to the semiconductor portion 35 via the drain electrode portion 44. Formed on the switching element portion 30, the gate wiring portion 40 and the source wiring portion 42 is the insulating portion 61.

Figure 16:
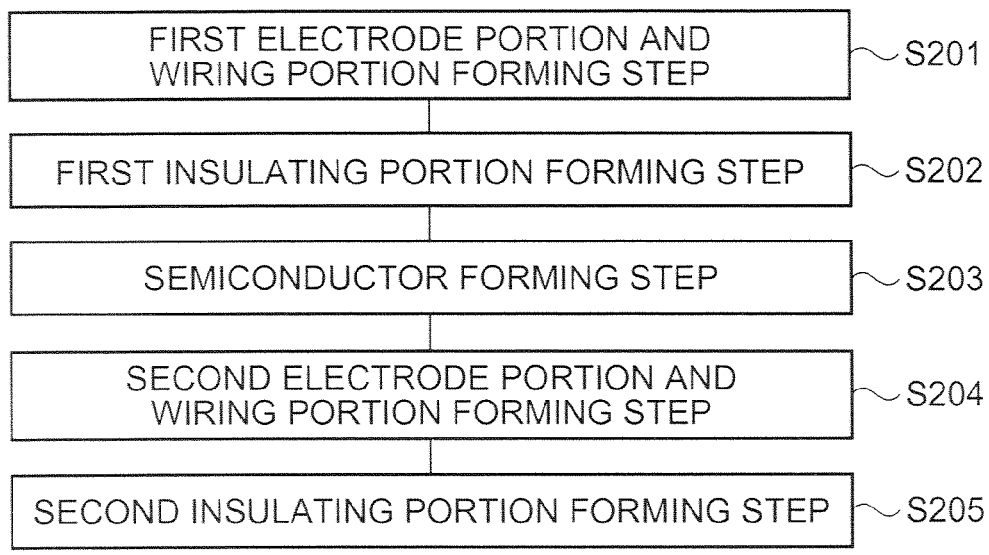
FIG. 16 is a process chart showing a method for manufacturing the active matrix substrate.

Then, a method for manufacturing the active matrix substrate will be described. FIG. 16 is a process chart showing the method for manufacturing the active matrix substrate according to this embodiment of the invention. As shown in FIG. 16, the method for manufacturing the active matrix substrate according to the invention includes a step S201 corresponding to a first electrode portion and wiring portion forming step, a step S202 corresponding to a first insulating portion forming step, a step S203 corresponding to a semiconductor forming step, a step S204 corresponding to a second electrode portion and wiring portion forming step, and a step S205 corresponding to a second insulating portion forming step. It should be noted that the step S202, the step S203, and the step S205 are based on the known technique. Therefore, the explanation of the step S202, the step S203, and the step S205 is omitted.

Figure 17:
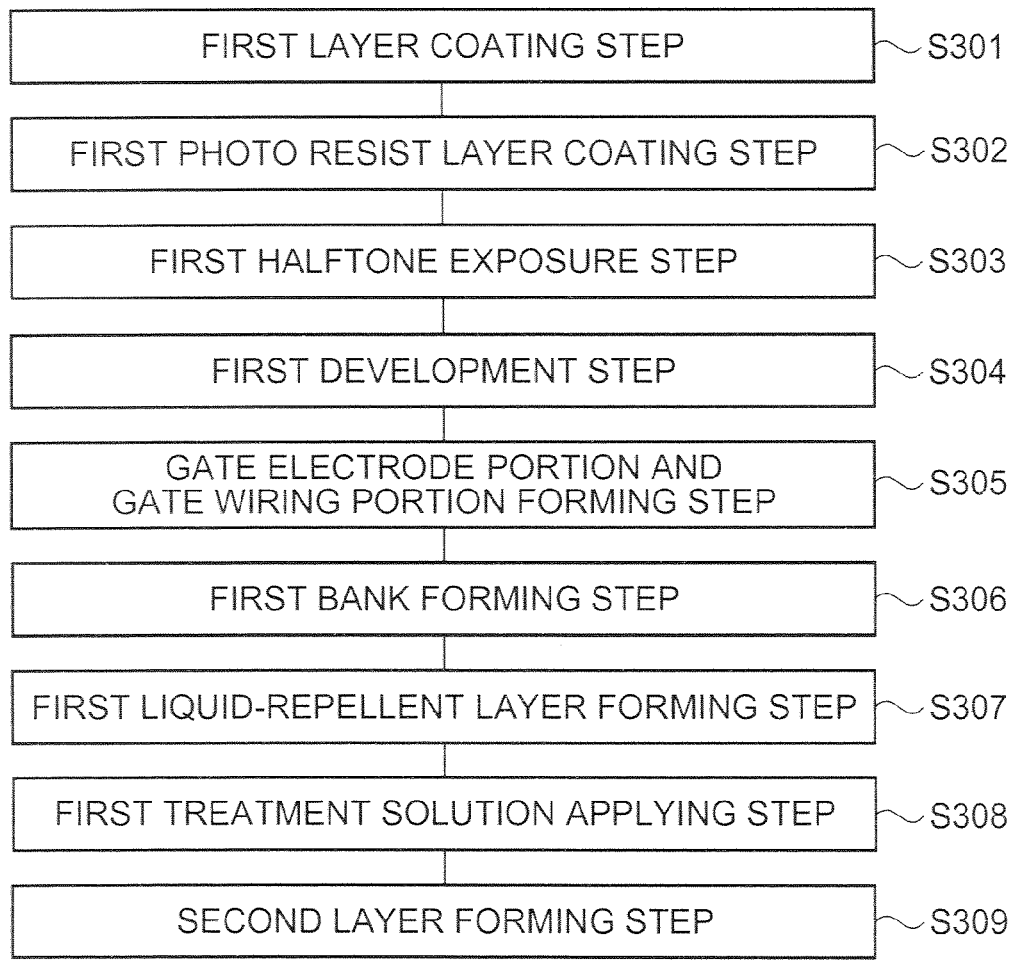
FIG. 17 is a detailed process chart included in a first electrode portion and wiring portion forming step.

Now, the step S201 and the step S204 will be explained. FIG. 17 shows a detailed process chart included in the step S201. As shown in FIG. 17, the step S201 has a step S301 corresponding to a first layer coating step, a step S302 corresponding to a first photo resist coating step, a step S303 corresponding to a first halftone exposure step, a step S304 corresponding to a first development step, a step S305 corresponding to a gate electrode portion and gate wiring portion forming step, a step S306 corresponding to a first bank forming step, a step S307 corresponding to a first liquid-repellent layer forming step, a step 308 corresponding to a first treatment solution applying step, and a step 309 corresponding to a second layer forming step.

Figure 18:
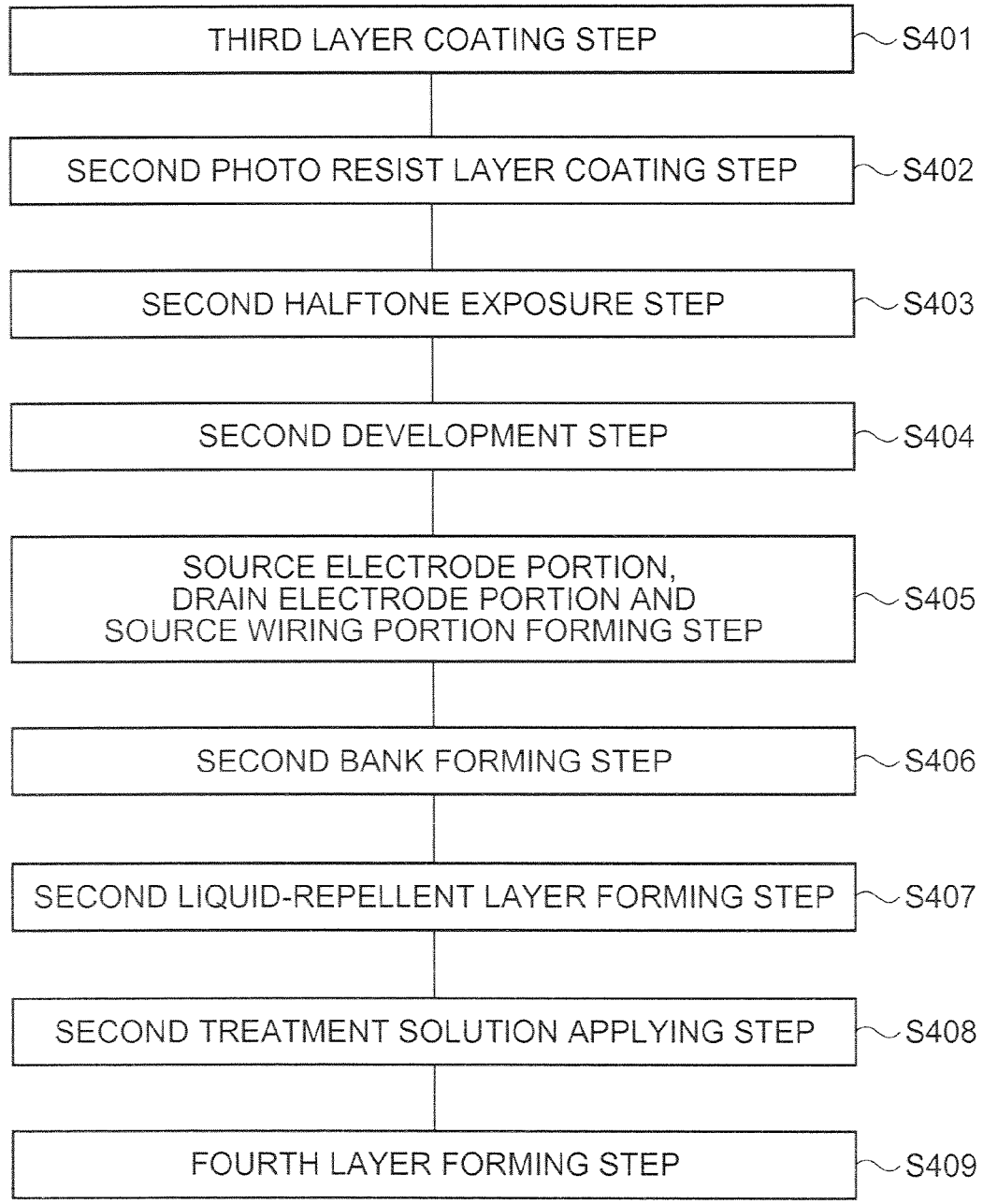
FIG. 18 is a detailed process chart included in a second electrode portion and wiring portion forming step.

FIG. 18 is a detailed process chart included in the step S204. As shown in FIG. 18, the step S204 has a step S401 corresponding to a third layer coating step, a step S402 corresponding to a second photo resist coating step, a step S403 corresponding to a second halftone exposure step, a step S404 corresponding to a second exposure step, a step S405 corresponding to a source electrode portion, drain electrode portion and source wiring portion forming step, a step S406 corresponding to a second bank forming step, a step S407 corresponding to a second liquid-repellent layer forming step, a step S408 corresponding to a second treatment solution applying step, and a step S409 corresponding to a fourth layer forming step.

Hereinafter, the step S301 through the step S309 will be described with reference to FIG. 17, FIG. 14, FIG. 15A and FIG. 15b. The step S301 through the step S309 are basically the same as the step S101 through the step S109. Therefore, the explanation of the same contents will be omitted and only the different contents will be described. First of all, the portion and elements shown in the step S101 through the step S109 should be replaced by the different portions and elements shown in the step S301 through the step S309. In the following, the portions and elements in question will be compared and listed up: the glass substrate 1, the bank 9, the liquid-repellent layer 11, the electrode portion 10, the wiring portion 15 should be respectively replaced by the glass substrate 20, the first bank 70, the first liquid-repellent layer 71, the gate electrode portion 41, the gate wiring portion 40. On the basis of the above replacement, the step S101 through the step S109 should be carried out (for the step S101 through the step S109, see the first embodiment), thereby completing the step S301 through the step S309. By performing the step S301 through the step S309, formed on the glass substrate 20 are the Ti layer 3 as the first layer and the Al layer 14 as the second layer. The gate electrode portion 41 and the gate wiring portion 40 are formed by the Ti layer 2. The Al layer 14 is formed on the gate wiring portion 40. As a result, a wiring thickness d4 of the gate wiring portion 40, which has been thickened by the Al layer 14, is thicker than an electrode thickness d3 of the gate electrode portion 41.

Now, the step S401 through the step S409 will be described with reference to FIG. 18, FIG. 14, FIG. 16A and FIG. 15B. The step S401 through the step S409 are also basically the same as the step S101 through the step S109. Therefore, the explanation of the same contents will be omitted and only the different contents will be described. First of all, the portion and elements shown in the step S101 through the step S109 should be replaced by the different portions and elements shown in the step S401 through the step S409. In the following, the portions and elements in question will be compared and listed up: The glass substrate 1 should be replaced by the glass substrate 20 after the step S203, the bank 9 should be replaced by the second bank 75, the liquid-repellent layer 11 should be replaced by the second liquid-repellent layer 76, the electrode portion 11 should be replaced by the source electrode portion 43 and the drain electrode portion 44, the wiring portion 15 should be replaced by the source wiring portion 42, the Ti layer 2 as the first layer should be replaced by the Ti layer 16 as the third layer, and the Al layer 14 as the second layer should be replaced by the Al layer 17 as the fourth layer. On the basis of the above-mentioned replacement, the step S101 through the step 109 should be carried out (for the step S101 through the step S109, see the first embodiment), thereby completing the step S401 through the step S409. By performing the step S401 through the step S409, formed on the glass substrate 20 after the step S203 are the Ti layer 16 as the third layer and the Al layer 17 as the fourth layer. The source electrode portion 43, the drain electrode portion 44 and the source wiring portion 42 are formed by the Ti layer 16. Formed on the source wiring portion 42 is the Al layer 17. As a result, a wiring thickness d6 of the source wiring portion 42, which has been thickened by the Al layer 17, is thicker than an electrode thickness d5 of the source electrode portion 43 and the drain electrode portion 44.

According to the second embodiment described above, the following advantageous effects can be obtained:

(5) Compared with the electrode thickness d3 of the gate electrode portion 41 formed on the switching element portion 30, the wiring thickness d4 of the gate wiring portion 40, which has been thickened by the Al layer 14, is thicker. Further, compared with the electrode thickness d5 of the source electrode portion 43 and the drain electrode portion 44, the wiring thickness d6 of the source wiring portion 42, which has been thickened by the Al layer 17, is thicker. The wiring thicknesses d4, d6 are thicker, so the respective sectional areas of the gate wiring portion 40 and the source wiring portion 42 become large. As a result, it becomes possible to make the electric resistance value of the gate wiring portion 40 and the source wiring portion 42 smaller. Therefore, further low power consumption of the liquid crystal display apparatus 100 can be achieved.

(6) The gate electrode portion 41 and the gate wiring portion 40 are formed by the Ti layer 2. The gate electrode portion 41 and the gate wiring portion 40 are formed in a manner that the glass substrate 20 serves as a foundation. The Ti layer 2 has such characteristics that it firmly combines with Si of metalloid element constituting the glass substrate 20 and metallic elements through the intermediation of oxygen or nitrogen. Accordingly, the close contact between the Ti layer 2 and the glass substrate 20 can be made sufficient. Therefore, the durability of the liquid crystal display apparatus 100 can be further enhanced.

(7) The source electrode portion 43, the drain electrode portion 44 and the source wiring portion 42 are formed by the Ti layer 16. The source electrode portion 43, the drain electrode portion 44, and the source electrode portion 42 are formed in a manner that the second semiconductor portion 35b of the semiconductor portion 35 (doped amorphous silicon) or the insulating portion 50 (silicon nitride) serves as a foundation. The Ti layer 16 has such characteristics that it firmly combines with the doped amorphous silicon or the silicon constituting the silicon nitride through the intermediation of oxygen or nitrogen. Therefore, the close contact between the Ti layer 16 and the foundation can be made sufficient. Accordingly, the durability of the liquid crystal display apparatus 100 can be further enhanced.

(8) Formed on the gate wiring portion 40 formed by the Ti layer 2 is the Al layer 14. As a result, the Ti layer 2 and the Al layer 14 come in direct contact with each other in the vicinity of their interface, so the metallic bonding can be easily take place. Therefore, the close contact and the conductivity between the Ti layer 2 and the Al layer 14 can be made sufficient. Further, Al of the Al layer 14 has such characteristics that it has relatively small electric resistance value among metallic elements. Hence, the electric resistance value of the gate wiring portion 40, which has been thickened by the Al layer 14, can be made relatively easily smaller. Accordingly, further low power consumption of the liquid crystal display apparatus 100 can be achieved.

(9) Formed on the source wiring portion 42 formed by the Ti layer 16 is the Al layer 17. As a result, the Ti layer 16 and the Al layer 17 come in direct contact with each other in the vicinity of their interface and the metallic bonding can be easily occur. Therefore, the close contact and the conductivity between the Ti layer 16 and the Al layer 17 can be made sufficient. Further, Al of the Al layer 17 has such characteristics that it has relatively small electric resistance value among metallic elements. Hence, the electric resistance value of the source wiring portion 42, which has been thickened by the Al layer 17, can be made relatively easily smaller. Accordingly, further low power consumption of the liquid crystal display apparatus 100 can be achieved.

(10) According to sputtering technique, Ti particles, which are to constitute the Ti layers 12, 16, can be imparted with high energy. Therefore, the close contact between the Ti layer 2 and the glass substrate 2 as its foundation, and between the Ti layer 16 and the second semiconductor portion 36 or the insulating portion as its foundation can be made more sufficient. Hence, the durability of the liquid crystal display apparatus 100 can be further enhanced.

(11) According to droplet discharge technique, a thick layer can be formed only at the desired site in a relatively short time. Therefore, it becomes possible to easily form the Al layer 14 having large thickness and small electric resistance value only on the gate wiring portion 40. Further, it becomes possible to easily form the Al layer 17 having large thickness and small electric resistance value only at the source wiring portion 42. Therefore, the low power consumption of the liquid crystal display apparatus 100 can be achieved at low cost.

(12) The non-exposure portion and the half exposure portion of the photo resist layer formed in one step serve as corrosion-resistant layers at the time of etching of Ti layer 2 for forming the gate electrode portion 41 and the gate wiring portion 40. Further, the pair of non-exposure portions serves as the pair of first banks 70 for maintaining the treatment solution 13 for forming the Al layer 14. As a result, the photo resist layer does not have to be formed in two steps of which one is for forming the corrosion-resistant layers and the other is for forming the pair of first banks 70. Accordingly, the method for manufacturing the liquid crystal display apparatus can be achieved, according to which the fabrication of the gate electrode portion 41 and the gate wiring portion 40 on the glass substrate 20 can be simplified (with small number of steps) at low material cost.

(13) The gate electrode portion 41 and the source electrode portion 40 are formed by the Ti layer 2 and the Al layer 14 is formed on the gate wiring portion 40. Therefore, it becomes possible to achieve the method for manufacturing the liquid crystal display apparatus, according to which the wiring thickness d4 of the gate wiring portion 40, which has been thickened by the Al layer 14, is thicker than the electrode thickness d3 of the gate electrode portion 41.

(14) The non-exposure portion and the half exposure portion of the photo resist layer formed in one step serve as corrosion-resistant layers at the time of etching of the Ti layer 16 for forming the source electrode portion 43, the drain electrode portion 44, and the source wiring portion 42. Further, the pair of non-exposure portions serves as the pair of second banks 75 for maintaining the treatment solution 13 for forming the Al layer 17. As a result, the photo resist layer does not have to be formed in two steps, of which one is for forming the corrosion-resistant layers and the other is for forming the pair of second banks 75. Therefore, the method for manufacturing the liquid crystal display apparatus can be achieved, according to which the fabrication of the source electrode portion 43, the drain electrode portion 44 and the source wiring portion 42 on the glass substrate 20 can be simplified (with small number of steps) at low material cost.

(15) The source electrode portion 43, the drain electrode portion 44 and the source wiring portion 42 are formed by the Ti layer 16. Formed on the source wiring portion 42 is the Al layer 17. Accordingly, the method for manufacturing the liquid crystal display apparatus can be achieved, according to which the wiring thickness d6 of the source wiring portion 42, which has been thickened by the Al layer 17, is thicker than the electrode thickness d5 of the source electrode portion 43 and the drain electrode portion 44.

(16) Compared with the electrode thickness d3 of the gate electrode portion 41 of the switching element portion 30, the wiring thickness d4 of the gate wiring portion 40, which has been thickened by the Al layer 14, is formed to be thicker. The wiring thickness d4 is formed to be thicker, thereby making it possible to make the sectional area of the gate wiring portion 40 large. As a result, the gate wiring portion 40 having small electric resistance value can be formed. Therefore, it becomes possible to achieve the method for manufacturing the liquid crystal display apparatus whose power consumption is reduced.

(17) Compared with the electrode thickness d5 of the source electrode portion 43 and the drain electrode portion 44 of the switching element portion 30, the wiring thickness d6 of the source wiring portion 42 formed to be thicker. The wiring thickness d6 of the source wiring portion 42, which has been thickened by the Al layer 17, is formed to be thicker, thereby making it possible to make the sectional area of the source wiring portion 42 large. As a result, it becomes possible to form the source wiring portion 42 having small electric resistance value. Therefore, the method for manufacturing the liquid crystal display apparatus whose power consumption is reduce can be achieved.

(18) The first liquid-repellent layer 71 having elemental fluorine is formed on the pair of first banks 70. The first liquid-repellent layer 71 including elemental fluorine has low surface tension due to elemental fluorine. As a result, the surface tension of the treatment solution is larger than that of the first liquid-repellent layer 71. Accordingly, the treatment solution applied on the first liquid-repellent layer 71 has a round surface shape. As a result, it becomes possible to prevent the treatment solution from leaking out of the pair of first banks 70. Further, the second liquid-repellent layer 76 including elemental fluorine is formed on the pair of second banks 75. The second liquid-repellent layer 75 including elemental fluorine has low surface tension due to elemental fluorine. Therefore, the surface tension of the treatment solution is larger than that of the second liquid-repellent layer 76. As a result, the treatment solution applied on the second liquid-repellent layer 76 has a round surface shape. Hence, it becomes possible to prevent the treatment solution from leaking out of the pair of second banks 75. Accordingly, it becomes possible to achieve the method for manufacturing the liquid crystal display apparatus with excellent yield.

Third Embodiment

Figure 19A:
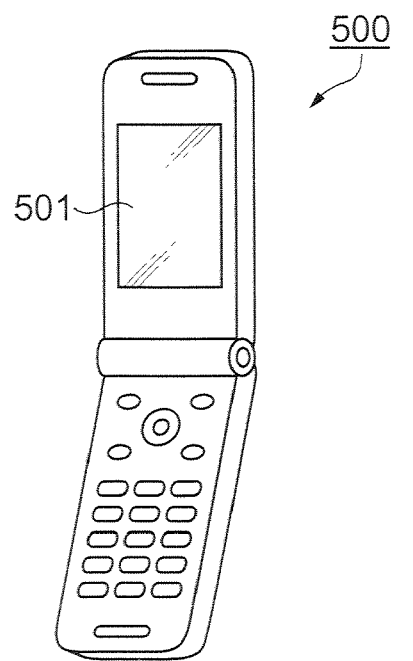
FIG. 19A is a perspective view showing an electronic device according to a third embodiment.
Figure 19B:
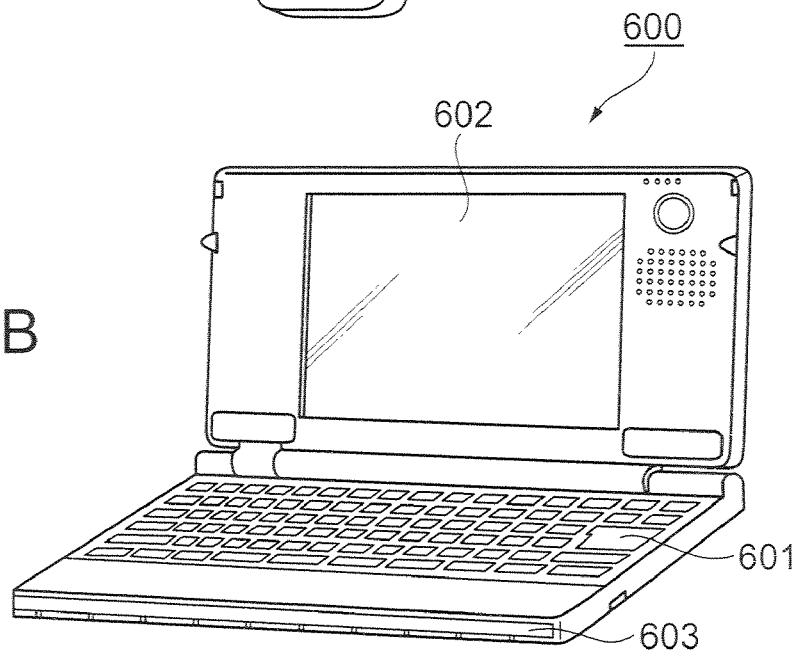
FIG. 19B is a perspective view showing another electronic device according to the third embodiment.
Figure 19C:
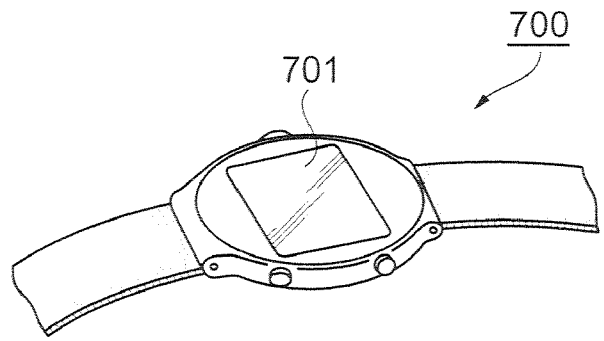
FIG. 19C is a perspective view showing yet another electronic device according to the third embodiment.

As for the third embodiment of the invention, the explanation of the same contents as the above-mentioned embodiments is omitted and only the different contents will be described. FIG. 19A is a perspective view showing a cellular phone as an electronic device according to the third embodiment. FIG. 19B is a perspective view showing a portable information processing device such as a word processor or a personal computer. FIG. 19C is a perspective view showing an electronic device of wristwatch type. As shown in FIG. 19A through FIG. 19C, the cellular phone 500 includes the liquid crystal display apparatus 100 in a display portion 501. Further, the potable information processing device 600 is provided with an input portion 601 such as a key board, an information processing main body 603, and a display portion 602. This display portion 602 includes the liquid crystal display apparatus 100. Furthermore, the electronic device 700 of wristwatch type includes the liquid crystal display apparatus 100 in a display portion 701.

According to the above-mentioned third embodiment, following advantageous effects can be obtained.

(19) The cellular phone 500 as an electronic device, the display portion 602 of the portable information processing device 600, and the display portion 701 of the electronic device 700 of wristwatch type each include the liquid crystal display apparatus 100. In other words, the display portions 501, 602, 701 each include the liquid crystal display apparatus 100, in which the low power consumption, the enhancement of the durability or the reduction in cost has been achieved. Alternatively, the display portions 501, 602, 701 are each provided with the liquid crystal display apparatus 100 formed on the basis of the method for manufacturing a liquid crystal display apparatus, according to which the simplification of the formation of the liquid crystal display apparatus 100 (with small number of steps) at low material cost is achieved, the wiring thicknesses d4, d6 are thicker than the electrode thicknesses d3, d5, the Al layers 14, 17 are relatively easily formed to have small electric resistance value, or excellent yield is achieved. As a result, it is possible to achieve the low power consumption, the enhancement of the durability or the reduction in cost of the cellular phone 500, the portable information processing device 600 and the electronic device 700 of wristwatch type.

It should be noted that the above-mentioned embodiments of the invention are not limited to the contents described above. Various changes other than the contents described above can be made as far as the gist of the above-mentioned embodiments of the invention is not departed. According to the above-mentioned embodiments of the invention, the glass substrate 1 is exemplarily mentioned as a substrate and the glass substrate 20 is exemplarily mentioned as an active matrix substrate. Apart from the exemplarily mentioned substrates made from glass, it is also possible to use various substrates made from quartz glass, a Si wafer, plastics or metal. Furthermore, formed on the surface of the glass, quartz glass, a Si wafer or plastics may be a semiconductor layer or a dielectric material layer, which is inorganic material, as a foundation layer.

Further, sputtering technique is exemplarily mentioned for the coating technique of the Ti layers 2, 16. However, it should not be construed restrictively. For the coating technique, dry deposition technique such as vapor deposition technique, ion plating technique and chemical vapor deposition (CVD) technique may be employed.

Furthermore, Ti is exemplarily mentioned for the material of the first and third layers. However, it should not be construed restrictively. The material including metallic element selected from Al, Cr, Zr, Nb, Mo and Ta may be used.

Moreover, Al is exemplarily mentioned for the material of the second and fourth layers. However, it should not be construed restrictively. The material including metallic element selected from Cu, Ni and Ag may be used.

Further, the hardening of the treatment solution 13 by heating is exemplarily mentioned. However, it should not be construed restrictively. It is also possible to perform hardening the treatment solution by irradiating it with infrared ray, leaving it in dry state or leaving it under reduced pressure.

Furthermore, for the coating technique of the photo resist layer 3, spinning technique is exemplarily mentioned. However, it should not be construed restrictively. Roll-coating technique, slitter technique or droplet discharge technique may be employed for the coating technique.

Moreover, for the etching technique of the exposed Ti layers 2, 16, dry etching technique is exemplarily mentioned, which utilizes gas including elemental fluorine. However, the element included in gas is not limited to elemental fluorine. It is also possible to employ gas including halogen element such as chloric element or bromine element.

Further, dry etching technique is exemplarily mentioned for the etching technique of the exposed Ti layers 2, 16. However, it should not be construed restrictively. It is also possible to employ wet etching technique utilizing water solution including various acids.

Furthermore, electromechanical transduction type ink-jet technique is exemplarily mentioned for the droplet discharge technique. However, it should not be construed restrictively. It is also possible to employ ink-jet technique of charge-controlling type, pressurized and oscillated type, electrothermal transduction type or electrostatic suction type.

Moreover, plasma processing technique utilizing gas including elemental fluorine is exemplarily mentioned for the forming technique of the liquid-repellent layer 11 on the bank 9. However, it should not be construed restrictively and it is possible to employ following techniques such as the forming technique using droplet discharge technique using solution of an organic coupling agent including elemental fluorine or the forming technique, according to which the photo resist layer 3 is formed by utilizing photo resist agent, into which a fluorine resin is mixed.

Further, the gate wiring portion 40, which has been thickened by the Al layer 14 and the source wiring portion 42, which has been thickened by the Al layer 17 are mentioned as examples. However, it should not be construed restrictively. On of those layers may be thickened.

What is claimed is:

1. A method for manufacturing a substrate, comprising:
coating the substrate with a first layer including a first metallic element by a dry deposition technique;
coating the first layer with a photo resist layer;
forming on the photo resist layer an exposure portion, a pair of non-exposure portions being in contact with the exposure portion and having a substantially parallel stripe-like plan shape, and a half exposure portion that is a part of an inner region of the non-exposure portions and an outer region of the non-exposure portions;
removing the exposure portion and an upper portion of the half exposure portion, the upper portion having been exposed;
forming an electrode portion and a wiring portion by etching the first layer having been exposed by removing the exposure portion;
exposing the electrode portion and the wiring portion by removing the half exposure portion of which the upper portion has been removed, and forming a pair of banks by the pair of non-exposure portions;

applying a treatment solution including a second metallic element on a recess portion formed by the wiring portion sandwiched between the pair of banks and the pair of banks by a droplet discharge technique; and forming a second layer including the second metallic element on the wiring portion by hardening the applied treatment solution to thicken the wiring portion.

2. A method for manufacturing a liquid crystal display apparatus including an active matrix substrate, comprising:

(a) coating the active matrix substrate with a first layer including a first metallic element by a dry deposition technique;

(b) coating the first layer with a photo resist layer;

(c) forming on the photo resist layer an exposure portion, a pair of non-exposure portions being in contact with the exposure portion and having a substantially parallel stripe-like plan shape, and a half exposure portion that is a part of an inner region of the non-exposure portions and an outer region of the non-exposure portions by a halftone exposure;

(d) removing the exposure portion and an upper portion of the half exposure portion, the upper portion having been exposed;

(e) forming an electrode portion and a wiring portion by etching the first layer exposed by removing the exposure portion;

(f) exposing the electrode portion and the wiring portion by removing the half exposure portion of which the upper portion has been removed, and forming a pair of banks by the pair of non-exposure portions;

(g) applying a treatment solution including a second metallic element on a recess portion formed by the wiring portion sandwiched between the pair of banks and the pair of banks by a droplet discharge technique; and (h) forming a second layer including the second metallic element on the wiring portion by hardening the applied treatment solution to thicken the wiring portion.

3. The method for manufacturing a liquid crystal apparatus according to claim 2, wherein:

the active matrix substrate is formed by an inorganic substrate;

the first metallic element is a metallic element selected from Al, Ti, Cr, Zr, Nb, Mo and Ta; and the second metallic element is a metallic element selected from Al, Cu, Ni and Ag.

4. The method for manufacturing a liquid crystal display apparatus according to claim 2, further comprising, between step (f) and step (g), forming a liquid-repellent layer on the pair of banks.

* * * * *